US 9,583,841 B2

(12) United States Patent
Forslund et al.

(10) Patent No.: US 9,583,841 B2
(45) Date of Patent: Feb. 28, 2017

(54) BALUN

(71) Applicant: SAAB AB, Linkoeping (SE)

(72) Inventors: Ola Forslund, Sundbyberg (SE);
Henrik Holter, Saltsjoe-Boo (SE);
Andreas Wikstroem, Lindome (SE)

(73) Assignee: SAAB AB, Linkoeping (SE)

( * ) Notice: Subject to any disclaimer, the term of this patent is extended or adjusted under 35 U.S.C. 154(b) by 0 days.

(21) Appl. No.: 15/100,844

(22) PCT Filed: Dec. 19, 2013

(86) PCT No.: PCT/SE2013/051578
§ 371 (c)(1),
(2) Date: Jun. 1, 2016

(87) PCT Pub. No.: WO2015/094056
PCT Pub. Date: Jun. 25, 2015

(65) Prior Publication Data
US 2016/0308284 A1    Oct. 20, 2016

(51) Int. Cl.
*H01P 5/10* (2006.01)
*H03H 7/42* (2006.01)
(Continued)

(52) U.S. Cl.
CPC ............ *H01Q 21/0006* (2013.01); *H01P 5/10* (2013.01); *H01Q 1/50* (2013.01); *H01Q 21/061* (2013.01);
(Continued)

(58) Field of Classification Search
CPC ................... H03H 7/42; H01P 5/10
(Continued)

(56) References Cited

U.S. PATENT DOCUMENTS 5,025,232 A    6/1991 Pavio
6,351,192 B1   2/2002 Sheen
(Continued)

FOREIGN PATENT DOCUMENTS

EP    0146086 A2    6/1985
EP    2432072 A1    3/2012
(Continued)

OTHER PUBLICATIONS

Marchand, N., "Transmission-Line Conversion Transformers", *Electronics*, Dec. 1944, pp. 142-145, vol. 17, No. 12, McGraw Hill, U.S.A.
(Continued)

*Primary Examiner* — Dean Takaoka
(74) *Attorney, Agent, or Firm* — Alston & Bird LLP

(57) ABSTRACT

The present disclosure relates to a balun suitable for realizing a wideband transition in the radio frequency band from an unbalanced transmission line to a balanced transmission line. The balun comprises an input terminal; a two conductor output terminal; and a layered structure comprising a number of conducting layers and dielectric layers alternatingly arranged on top of each other. The layered structure comprises at least one ground plane layer and at least one signal transmission layer. The input terminal has a signal connection point and a screen connecting point. An unbalanced signal path is connected to the signal connection point and the screen connecting point of the input terminal. A balanced signal path is connected to the output terminal and being part of the layered structure. A balun transition region transforms the signal from an unbalanced signal to a balanced signal. The balun transition region comprises a non-conducting gap between the screen of the unbalanced signal and a dummy screen structure. The dummy screen structure is a mirror structure, mirrored in a plane of the gap, of a horizontal
(Continued)

portion of the unbalanced signal path before the gap. A central conductor or signal conductor of the unbalanced signal path traverses the gap and enters a volume defined by the dummy screen structure. The screen of the unbalanced signal in the vicinity of the gap forms a first balanced conductor being part of the layered structure and the screen of the dummy screen structure, in vicinity of the gap, forms a second balanced conductor being part of the layered structure.

26 Claims, 24 Drawing Sheets

(51) Int. Cl.
  *H01Q 21/00* (2006.01)
  *H01Q 21/06* (2006.01)
  *H01Q 21/24* (2006.01)
  *H01Q 1/50* (2006.01)
  *H05K 1/02* (2006.01)
  *H05K 1/16* (2006.01)

(52) U.S. Cl.
  CPC .............. *H01Q 21/24* (2013.01); *H03H 7/422* (2013.01); *H05K 1/0298* (2013.01); *H05K 1/16* (2013.01)

(58) Field of Classification Search
  USPC ................................................ 333/25, 26, 4
  See application file for complete search history.

(56) References Cited

U.S. PATENT DOCUMENTS

| | | |
|---|---|---|
| 7,692,601 B2 | 4/2010 | Bisiules et al. |
| 8,283,991 B1 | 10/2012 | Essenwanger |
| 2003/0001710 A1 | 1/2003 | Tang et al. |
| 2008/0258838 A1 | 10/2008 | Oshima |
| 2012/0146869 A1 | 6/2012 | Holland et al. |
| 2013/0162366 A1 | 6/2013 | Essenwanger |

FOREIGN PATENT DOCUMENTS

| | | |
|---|---|---|
| GB | 2399951 A | 9/2004 |
| WO | WO 2009/077791 A1 | 6/2009 |

OTHER PUBLICATIONS

Bailey, M.C., "Broad-Band Half-Wave Dipole", *IEEE Transactions on Antennas and Propagation*, Apr. 1984, pp. 410-412, vol. 32, No. 4, IEEE, U.S.A.

International Searching Authority, International Search Report for International Application No. PCT/SE2013/051578, Sep. 1, 2014, 5 pages, Swedish Patent and Registration Office, Sweden.

International Preliminary Examining Authority, International Preliminary Report on Patentability, including Applicant's Jan. 15, 2016 Response to the Nov. 19, 2015 Second Written Opinion, for International Application No. PCT/SE2013/051578, Apr. 11, 2016, 13 pages, Swedish Patent and Registration Office, Sweden.

International Preliminary Examining Authority, Second Written opinion for International Application No. PCT/SE2013/051578, Nov. 19, 2015, 9 pages, Swedish Patent and Registration Office, Sweden.

Johnson, R.C. (Editor), "Chapter 14: Frequency-Independent Antennas", *Antenna Engineering Handbook—Third Edition*, 1993, pp. 14-1-14-68, McGraw-Hill, Inc. U.S.A.

Pinto, J., et al., "Compact Wide-Band Baluns For Active Electronically Scanned Array Antennas", *Proceedings of 2013 Loughborough Antennas and Propagation Conference*, Nov. 11-12, 2013, pp. 315-320, Leicestershire, United Kingdom, IEEE.

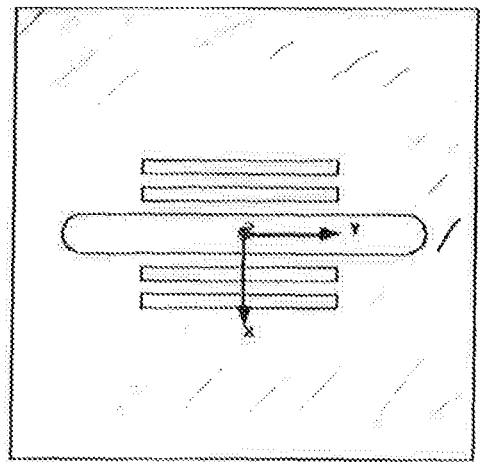
Fig. 12 (ICa)
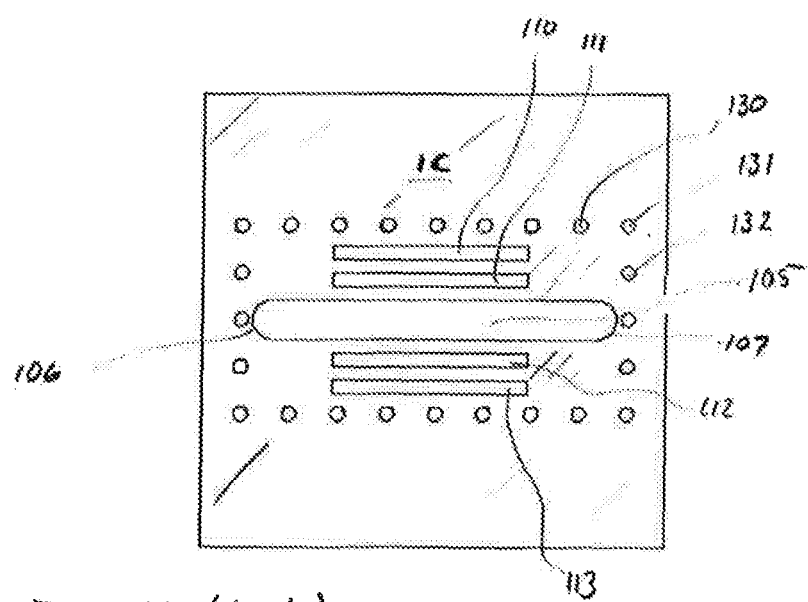
Fig 13 (ICb)

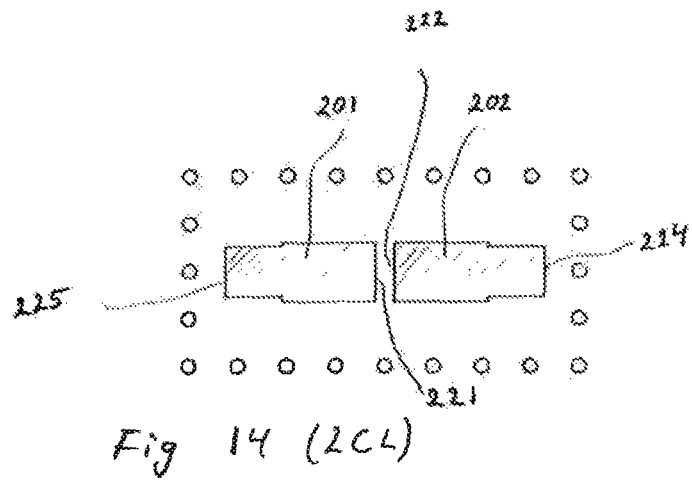
Fig 14 (2CL)
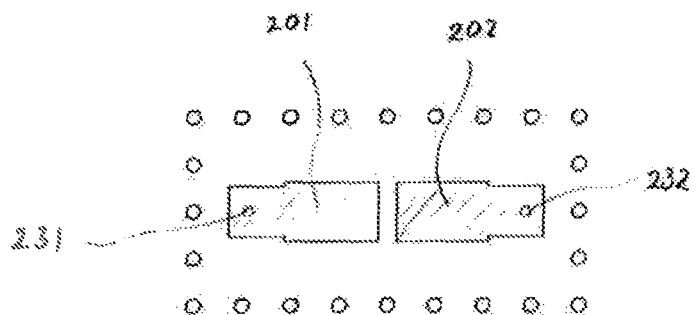
Fig. 15 (2CL*)

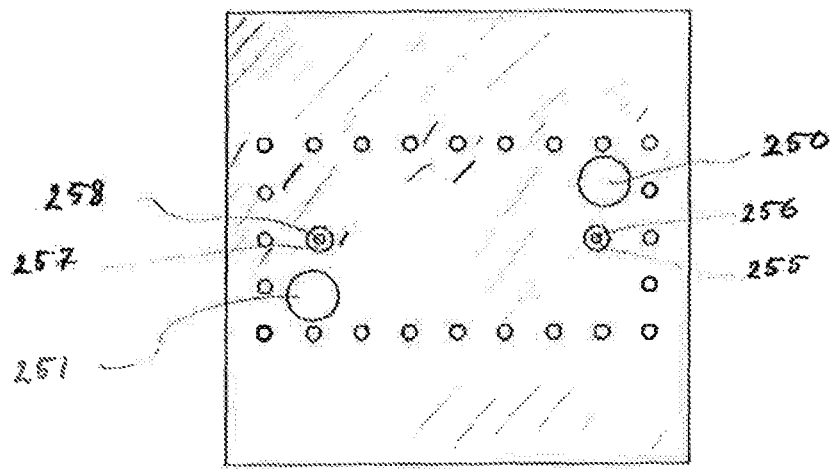
Fig. 16 (2Cu)
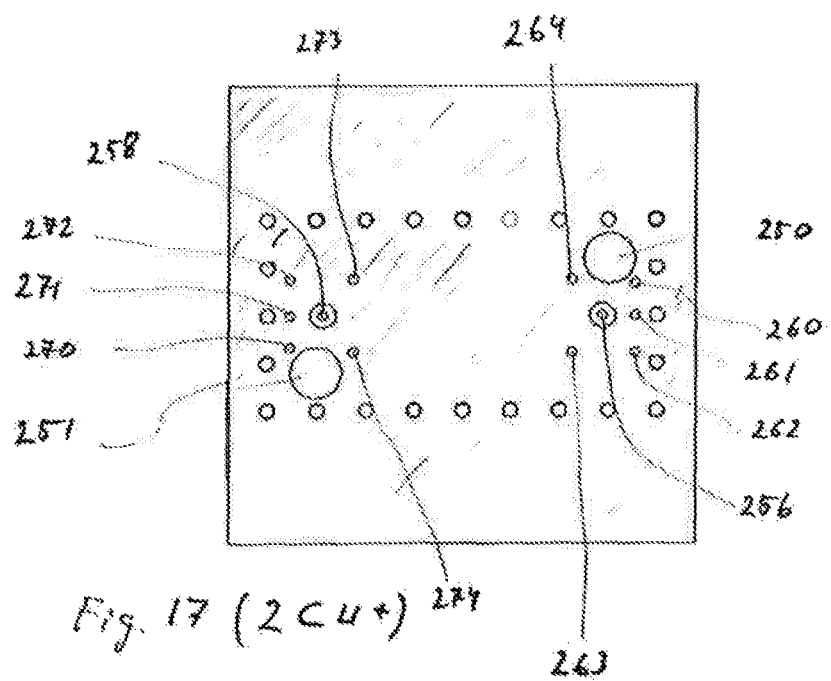
Fig. 17 (2Cu+)

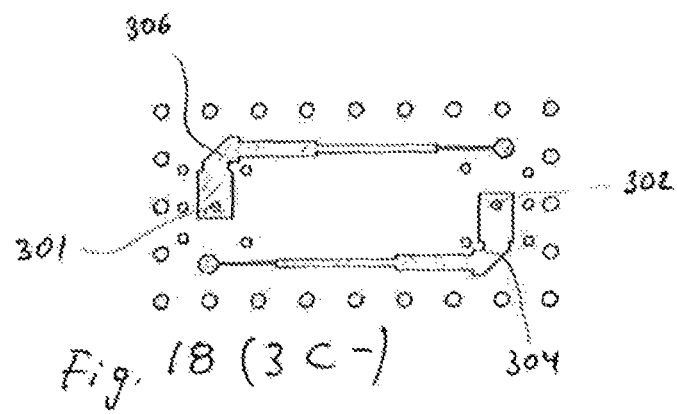
Fig. 18 (3C-)
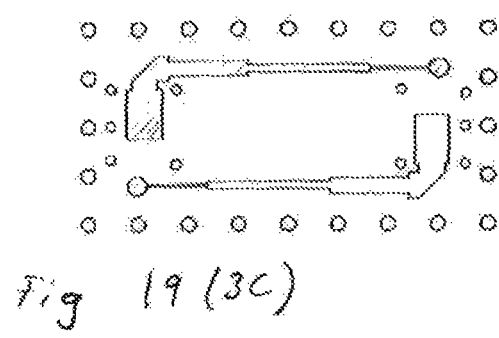
Fig 19 (3C)

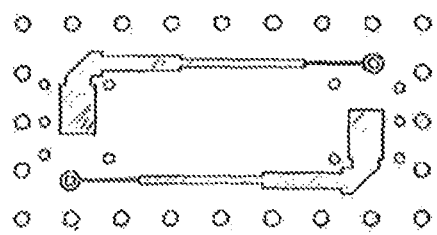
Fig. 20 (3C+)
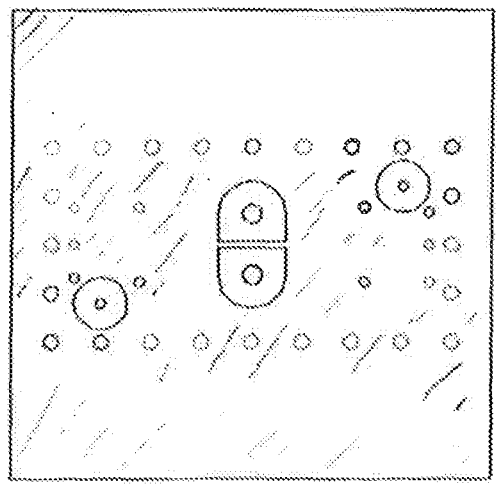
Fig. 21 (4C-)

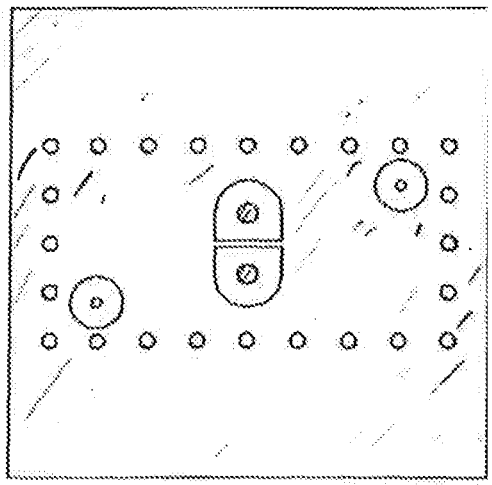
Fig. 22 (4C)
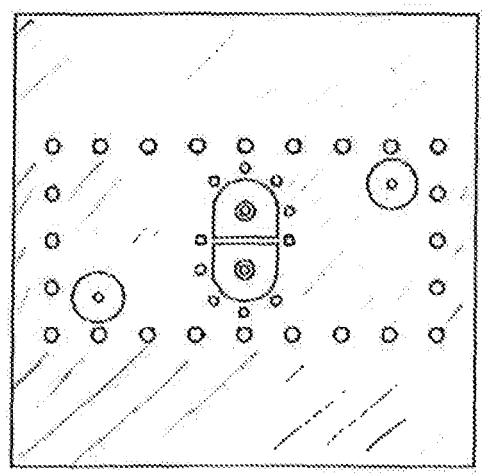
Fig. 23 (4C+)

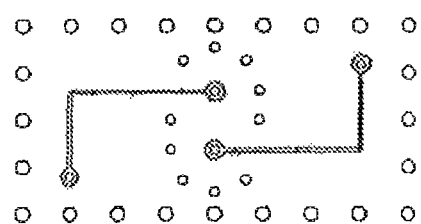
Fig. 24 (5C-)
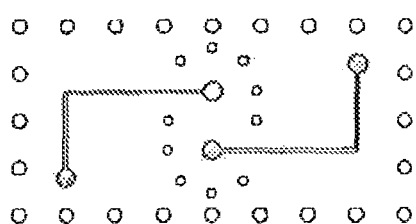
Fig. 25 (5C)

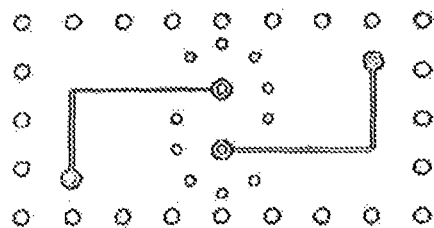
Fig. 26 (5C+)
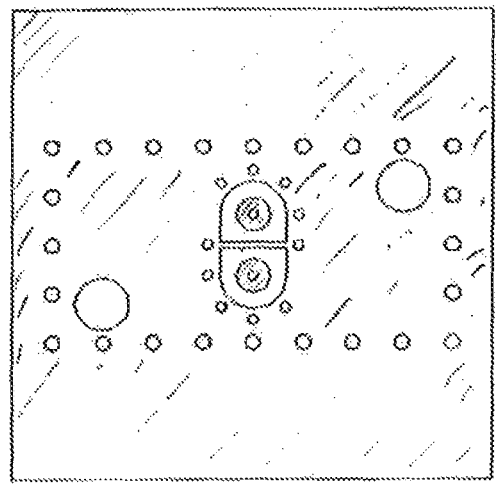
Fig. 27 (6C-)

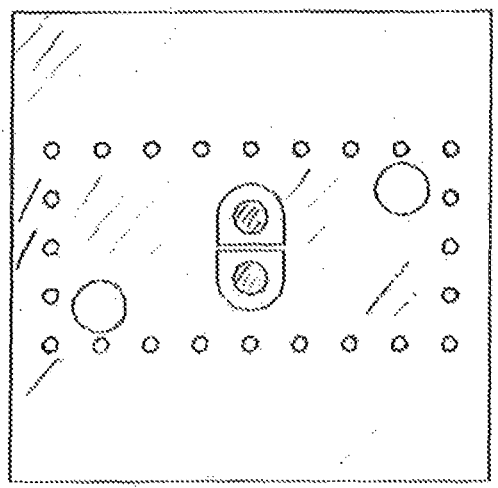
Fig. 28 (6c)
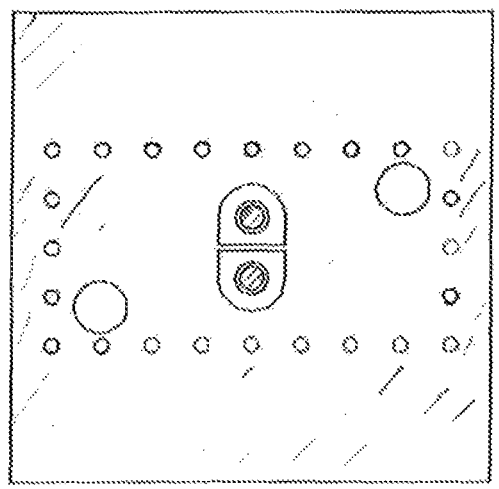
Fig. 29 (6c+a)

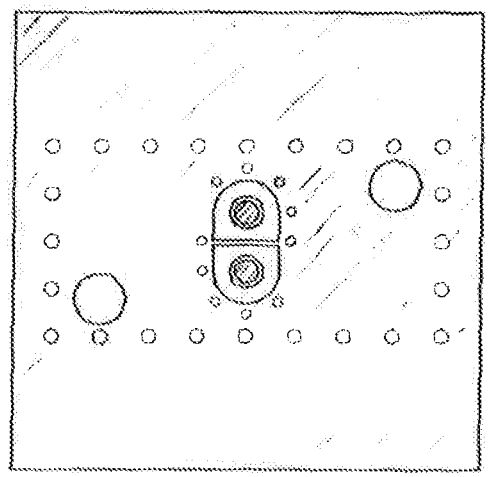
Fig 30 (6c+b)

A          B

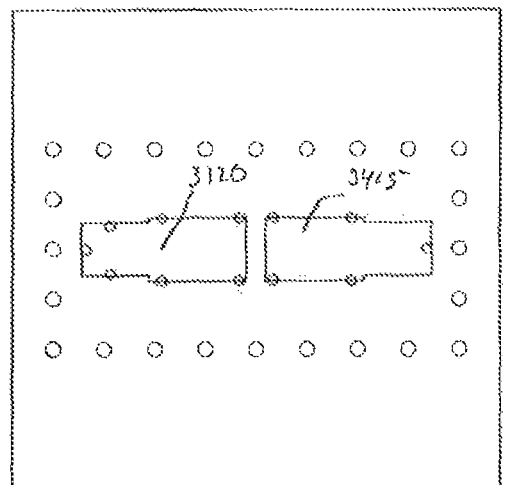
Fig. 32a (2CL-)
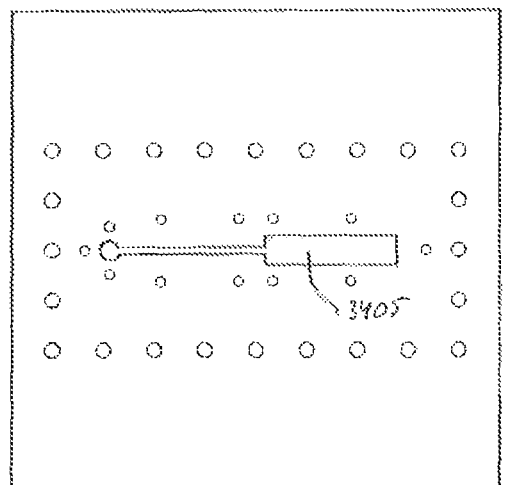
Fig. 32b (2-1C)

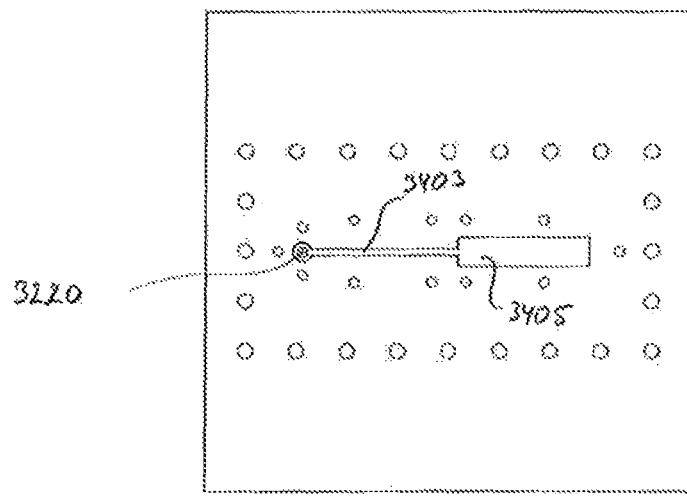
Fig. 32c (2.1c-)
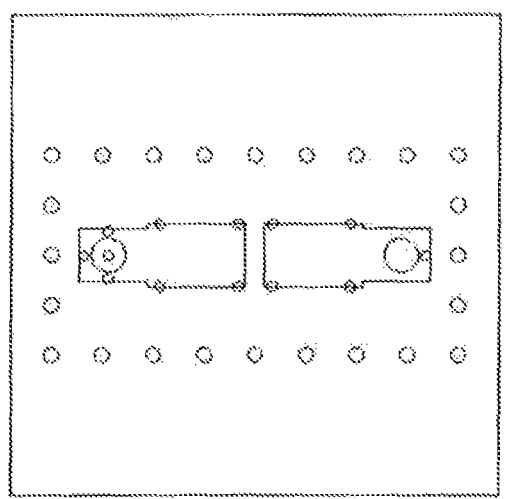
Fig 32d (2.2c)

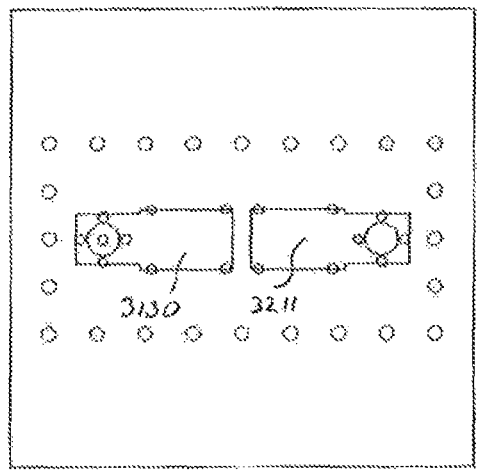
Fig. 32c (2.2c-)
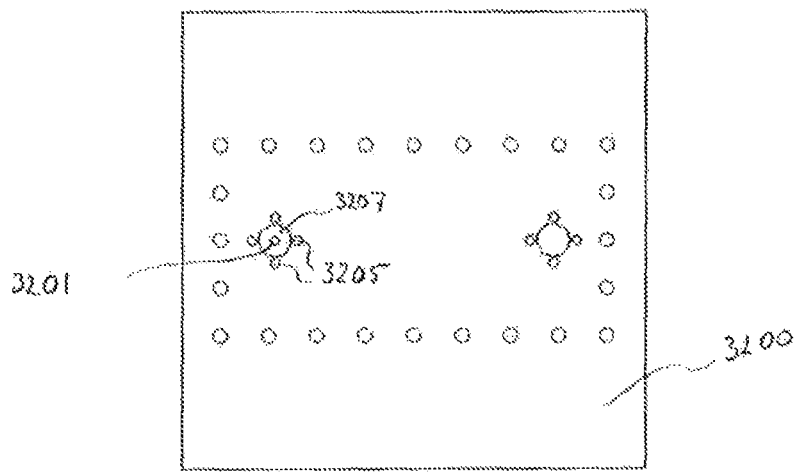
Fig. 32d (1c-)

BALUN

CROSS REFERENCE TO RELATED APPLICATIONS

This application is a National Stage Application, filed under 35 U.S.C. 371, of International Application No. PCT/SE2013/051578, filed Dec. 19, 2013, the contents of which as are hereby incorporated by reference in their entirety.

BACKGROUND

Related Field

The present invention relates to a class of electrical devices, called baluns, for achieving impedance transition from unbalanced coaxial transmission lines to balanced two-conductor transmission lines of (usually) higher impedance. In particular, the present invention relates to such baluns for use with antennas, even more particularly for use with dual polarized PCB antenna arrays.

Description of Related Art

An antenna often requires a balun, i.e. a transition from an unbalanced transmission line (e.g. micro strip line or a coaxial line) to a balanced line, in this case eventually a two-conductor line (also referred to as two-wire or twin-lead line. Often such a transition also involves, or even requires, an impedance transformer. Antennas often require baluns and this particular invention is intended to be used for instance in a phased array antenna, preferably implemented in printed circuit board (PCB) technology.

One simple example of an antenna device which requires a balun is an ordinary dipole wire antenna fed by a coaxial transmission line. A poor dipole antenna can be created by "peeling off" a bit of the screen and the dielectric at the end of a coaxial wire, bending the centre conductor an angle of 90 degrees and attaching an approximately equally long wire pointing in the opposite direction. Such a dipole will however induce currents on the outside of the cable screen resulting in unwanted radiation although it might be well matched at some frequency. A balun is required to remove these currents and to obtain a more "ideal" radiation pattern. However, since that type of dipole antenna is narrowband, only a narrowband balun is required. If a dipole is fed by a two-conductor line a balun is not required, but since two-conductor lines are impractical for transmission at microwave frequencies due to large radiation losses, they are not often used for this purpose. They are only used for very short distances, as in the case of the invention herein described.

M. C. Bailey. "Broad-Band Half-Wave Dipole". IEEE Transactions on Antennas and Propagation, vol. 32, no. 4, April 1984 discloses a dipole antenna in front of a ground plane is described. The dipole is mentioned as broadband, with a 37% bandwidth defined by a Voltage Standing Wave Ratio, VSWR less than 2. The dipole is fed via a coaxial line and has a balun built into the design in a natural way. A bandwidth of 37% can be said to be broadband concerning a dipole but in the context of the present application we consider balun bandwidths of more than an octave, typically 3:1, to be broadband. The notion 3:1 implies that the highest frequency of operation is three times greater than the lowest ditto.

Other types of antennas requiring baluns are various types of spiral antennas such as the ones described in reference "Antenna Engineering handbook", R. C. Johnsson (Ed.), Third ed., McGraw-Hill, 1993. chapter 14. Such antennas are usually broadband and require broadband baluns and impedance transformers. It is well known that broadband microwave devices as transformers, directional couplers etc. require volume. Sometimes they tend to occupy a space larger than desired.

In many antenna systems for transmission and reception requiring a balun, the balun is often a critical part regarding the electrical performance of the entire antenna system. Often an impedance transformer is also necessary in association with the balun and often the impedance transformer is integrated in or located close to the balun.

Often in the case of baluns, reference is made to an article considered as classical on the subject; N. Marchand. "Transmission line conversion Transformers". Electronics, vol. 17, pp. 142-146, December 1944. In this article the word balun is not used but many different baluns are since then referred to as various types of "Marchand baluns" in reference to the author of the article: Nathan Marchand.

EP 2432072 A1 discloses a small wideband balun, allowing a predetermined impedance transmission between an asymmetrical connection point (preferably coaxial connector) and two symmetrical connection points, in a multilayer circuit for a phased array network antenna.

U.S. Pat. No. 8,283,991 B1 discloses an assembly circuit for coupling unbalanced circuits with balanced circuits, wherein the assembly includes two broadband baluns in a balun circuit as implemented on a PCB assembly. The balun circuit includes an impedance transformer for converting to higher impedance balanced circuits.

WO 2009/077791 A1 discloses a compact feed module, preferably for a dual polarized array antenna, wherein the feed module comprises a PCB feed structure for coupling signals between connections to transmitters or receivers and connection points for connecting to the antenna elements of the array antenna.

U.S. Pat. No. 7,692,601 B2 discloses a coaxial (unbalanced) to micro strip (balanced) transition for dipole antennas using a pair of baluns for feeding a dual polarized antenna with orthogonal polarization.

BRIEF SUMMARY

Virtually all broadband PCB antenna array elements which can be found in the open literature are designed to be fed via two-conductor lines; in such feed arrangements a balun is a necessary and critical component to convert signals from the commonly used coaxial transmission line from/to the transmitter/receiver, but often the balun is not mentioned. The invention described in the present application is a balun intended for such a broadband array antenna.

Problems with prior art antenna baluns include
large size
being awkward to integrate with array antennas implemented in PCB technology, e.g. patch array antennas
Advantages of the balun of the present invention include
very small size/volume,
extremely thin,
designed in a way such that two baluns can be arranged in each antenna cell to feed a dual polarised PCB antenna array.
Few, if any, broadband baluns are known having all these advantages.

The present invention provides a balun for transitioning from an unbalanced transmission line, e.g. a coaxial or a combination of a coaxial or a coax-via-line and a strip transmission line to a balanced line, with the key features:
1) to be used for a phased array antenna and preferably implemented in a PCB, 2) small and thin design enabling that two slightly different versions of the balun can be placed in each antenna cell for feeding a dual polarized PCB antenna array 3) broadband and including an impedance transformer in order to transform the impedance from the low impedance end of the unbalanced transmission line to the high impedance end of the balanced line, and 4) sets of two small broadband baluns according to the invention can be arranged in a periodic lattice in order to feed an antenna array with two orthogonal polarizations.

With the above and following description in mind, an aspect of certain embodiments of the present invention is to provide a compact balun particularly suitable for the use and which can provide the above-mentioned features and advantages.

The present invention is defined by the appended independent claims. Various advantageous embodiments of the invention are set forth by the appended dependent claims as well as by the following description and the accompanying drawings.

With the above in mind, the object of the present invention is to overcome at least some of the disadvantages of known technology as described previously. The object of the present invention is thus to provide a volume efficient balun that also is easy to integrate with a PCB antenna array, e.g. a patch array antenna, particularly of the dual polarization type. One embodiment of the present disclosure relates to a balun suitable for realising a wideband transition in the radio frequency band from an unbalanced transmission line to a balanced transmission line. The balun comprises an input terminal; a two conductor output terminal; and a layered structure comprising a number of conducting layers and dielectric layers alternatingly arranged on top of each other. The layered structure comprises at least one ground plane layer and at least one signal transmission layer; The input terminal has a signal connection point and a screen connecting point. An unbalanced signal path is connected to the signal connection point and the screen connecting point of the input terminal. A balanced signal path is connected to the output terminal and is part of the layered structure. The layered structure comprises further a transition region for transforming the signal from an unbalanced signal to a balanced signal;

The balun transition region comprises a non-conducting gap between the screen of the unbalanced signal and a dummy screen structure. The dummy screen structure is a mirror structure, mirrored in a plane of the gap, of a horizontal portion of the unbalanced signal path before the gap. A central conductor or signal conductor of the unbalanced signal path traverses the gap and enters a volume defined by the dummy screen structure. The screen of the unbalanced signal in the vicinity of the gap is connected to a first balanced conductor being part of the layered structure and the screen of the dummy screen structure, in vicinity of the gap, is connected to a second balanced conductor being part of the layered structure.

The first balanced conductor and the second balanced conductor constitute a balanced line only as a pair because the signals (i.e currents and voltages associated with each line) are 180 degrees out of phase. Regarding each line (conductor) as isolated from the other they can both be seen as unbalanced lines with associated screen conductors.

In one option, at least a portion of the unbalanced signal path is constituted by a coaxial cable. The central conductor or signal conductor of the unbalanced signal path is then a central conductor.

In one option, the screens of the unbalanced coaxial line and its dummy counterpart are aligned with and in electrical contact with the first portions of the balanced signal paths (signal conductors).

In one option, at least a portion of the unbalanced signal path is constituted by a strip line transmission structure or a coax-via-line transmission structure or a combination thereof. The central conductor or signal conductor of the unbalanced signal path is then a central conductor. In accordance with this option, the screens (upper layers) of the of the strip line and its dummy counterpart simultaneously constitute the first portions of the balanced signal paths (signal conductors).

In one option, at least a portion of the unbalanced signal path comprises a micro strip. The central conductor or signal conductor of the unbalanced signal path is then a signal conductor. In accordance with this options the screens (i.e. upper groundplanes) of the unbalanced micro strip line and its dummy counterpart simultaneously constitute the first portions of the balanced signal paths (signal conductors).

In one option, the balanced signal path further comprises a dual impedance transformer. The dual impedance transformer is part of the layered structure.

In one option, the balun comprises at least one vertical transition from a layer of the balun transition region to a layer of the dual impedance transformer. The layer of the dual impedance transformer may be located above or below the layer of the balun transition region.

In one option, the balun comprises at least one vertical transition from one layer of the dual impedance transformer to another layer of the dual impedance transformer. The other layer of the dual impedance transformer may be located above or below the layer of the balun transition region.

In one option, the vertical transition is formed as signal vias.

In one option, the vertical transition traverses a ground plane and there is arranged a void in that ground plane. The diameter of the void corresponds for example to 3 to 5 times the diameter of the via.

In one option, the first ground connecting vias are arranged to connect ground conducting layers.

In one option, the first ground connecting vias form a preferably rectangular arrangement enclosing signal carrying portions of the balun.

In one option, a plurality of locally short circuiting, second ground connecting vias are arranged in a pattern around the signal vias. The plurality of locally short circuiting, second ground connecting vias are arranged to connect ground conducting layers so as to at least decrease a local potential difference between the ground conducting layers. The provided decreased local potential difference may be beneficial as the wavelength used characteristically is in the same order as the size of the balun.

In one option, the balun comprises
a first conducting layer;
a first dielectric layer;
a second conducting layer;
a second dielectric layer;
a third conducting layer;
a third dielectric layer;
a fourth conducting layer;
a fourth dielectric layer;
a fifth conducting layer;
a fifth dielectric layer (5);
a sixth conducting layer;
a sixth dielectric layer; and
a seventh conducting layer.

The first dielectric layer is arranged between the first and second conducting layers. The second dielectric layer is arranged between the second and third conducting layers, and so on. The first conducting layer comprises an oblong central void. The first dielectric layer is provided with a cavity corresponding to said central void, such that the coaxial cable can be made to fit in said cavity, the coaxial cable having a central inner conductor and a concentric shield conductor and a space between them which may be filled with a dielectric material such as a polymer.

The second conducting layer comprises a first conducting patch and a second conducting patch. The patches are for example arranged symmetrically with coinciding length axes parallel to the length axis of the oblong central void. A gap is arranged between a first end of the first patch and a first end of the second patch (223).

The shield conductor of the coaxial cable is arranged to make electrical contact to the first conducting patch. The shield conductor terminates at a position corresponding to the gap. The central inner conductor of the coaxial cable continues into a coaxial dummy line and is either terminated as an open circuit a distance into the dummy line or connected to the screen of the dummy line at the position of the gap.

Connecting signal vias are arranged to connect the patches of the second conducting layer with wide ends of preferably angled tapering patches of the third conducting layer.

In one option, the oblong central void has a first preferably rounded end and a second preferably rounded end. The central void is arranged to allow a coaxial cable just pass. A length of the central void is adapted to be a fraction of a predetermined wavelength within the frequency band to be transited.

In one option, the central void has a length axis which is a straight line.

In one option, the at least one additional oblong void is arranged beside the central void.

In one option, there are arranged at least one such additional oblong void on each side of the central void.

In one option, a plurality of locally short circuiting vias are arranged in a pattern around the signal vias (256; 258), and connecting the third conducting layer with the fourth conducting layer, and also with the fifth conducting layer.

One embodiment of the present disclosure relates to an antenna system. The antenna system comprises at least one antenna element; at least one transmitter and/or receiver, and at least one balun as described above operatively connected to the transmitter and/or receiver at the input terminal and to the at least one antenna element at the conductor output terminals.

In one option, the antenna system comprises at least one pair of baluns (e.g. in accordance with the geometrical cell arrangements of FIG. 8a) arranged to feed two antenna elements of orthogonal polarization (e.g. in accordance with the geometrical antenna cell arrangements of FIG. 1 or equivalent).

In one option, an imagined first straight line passing the two conductor output terminals of a first balun in the pair of baluns is orthogonal in relation to an imagined second straight line passing the two conductor output terminals of a second balun in the pair of baluns.

In one option, the first and second balun of each pair of baluns are arranged beside each other.

In one option, the first and second balun of each pair of baluns are arranged displaced in relation to each other.

In one option, the antenna elements are phased array antenna elements.

BRIEF DESCRIPTION OF THE FIGURES

Further objects and features, of the present invention will appear from the following detailed description of some embodiments/aspects of the invention, wherein some aspects of the invention will be described in more detail with reference to the accompanying drawings, in which:

FIG. 3a shows a transparent side view of the balun in FIG. 2a.

FIG. 4a shows another transparent side view of the balun in FIG. 2a.

FIG. 12 shows a top view of a first conducting layer of a balun.

FIG. 13 shows the first conducting layer of FIG. 12 including box shield vias.

FIG. 14 shows a top view of a second conducting layer of a balun.

FIG. 15 shows the top view of FIG. 14 including connection points for signal vias.

FIG. 16 shows a top view of a third conducting layer including holes for, signal vias and signal vias.

FIG. 17 shows the third conducting layer of FIG. 16 including signal shield vias.

FIG. 18 shows a fourth conducting layer comprising stepwise tapering conductors.

FIG. 19 shows the fourth conducting layer of FIG. 18 without signal via connection points to previous conductive layer.

FIG. 20 shows the fourth conductive layer of FIG. 19 including connection points for signal vias to a next conductive layer.

FIG. 21 shows a fifth conductive layer; a ground plane including voids for signal vias and connection points for shielding vias to connect to a previous layer of FIG. 17.

FIG. 22 shows the fifth conductive layer of FIG. 21.

FIG. 23 shows the fifth conductive layer of FIG. 22 including connection point for vias to a higher layer.

FIG. 24, 25, 26 shows a sixth conductive layer for connecting in a horizontal plane the tapering conductors of the fourth conductive layer with connection contact points for balanced output signal.

FIG. 27, 28, 29, 30 shows a seventh conductive layer; a ground plane including two central voids for letting through the balanced signal vias, and two peripheral voids for signal conditioning.

FIG. 32a shows a top view of upper screen layer of balun region of balun with strip line unbalanced signal path.

FIGS. 32b and 32c shows top views of a mid layer of balun region of balun with strip line unbalanced signal path.

FIGS. 32d and 32e shows top views of a lower screen layer of balun region of balun with strip line unbalanced signal path.

FIG. 32f shows a top view of a bottom ground layer of balun region of balun with strip line unbalanced signal path.

Figure 1:
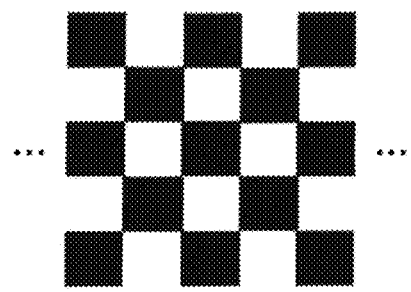
FIG. 1 shows simplified view from above of a dual polarized patch array antenna.

It should be added that the following description of the embodiments is for illustrative purposes only and should not be interpreted as limiting the invention exclusively to these embodiments/aspects.

DETAILED DESCRIPTION OF VARIOUS EMBODIMENTS

Embodiments of the present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

Terminology Used

In the present application the following word are used with the meaning specified Micro strip—a micro strip or a micro strip transmission line is an unbalanced electrical transmission line that can be fabricated using PCB technology. It has a certain cross section geometry including a signal conductor separated from a ground plane by a dielectric substrate.

A strip line or strip transmission line is an unbalanced electrical transmission line that can be fabricated using PCB technology. It has a certain cross section geometry including a signal conductor in-between two symmetrically (or unsymmetrically) located ground planes.

A two-conductor line is here understood as a balanced transmission line consisting of two parallel identical electrical conductors, preferably with circular cross section.

Coax-via-line is understood as a multiconductor transmission line with one centrally located conductor and some surrounding conductors preferably symmetrically located around the central conductor, and with the same potential acting as screen. In a typical case four symmetrically located conductors 3205 are used as screen. See e.g. FIG. 32f.

A via-hole is understood as a metal plated (preferably drilled) hole arranged to make metallic contact between two or more layers of conducting patterns in a PCB.

The particular class of baluns described in the present application are particularly suitable for use together with a broadband phased array antenna implemented in stratified layers of printed circuit boards where the printed radiating elements can consist of e.g. broadband dipoles fed by a two-conductor line, or of patches fed by two-conductor lines. See FIG. 1.

A balun according to the present disclosure is designed to convert between an unbalanced transmission line, such as a coaxial line (or a combined coax/coax-via-line/strip transmission line) and a two-conductor line. It may also comprise impedance transition means to make an impedance transition from a low impedance end (the coaxial) to a high impedance end with two-conductor lines. The balun is devised to be broadband, very small and in particular flat with respect to the stratified layers. The balun and its associated impedance transition means mainly occupy space with respect to the lateral directions; it is very thin with respect to the orthogonal direction which is considered important. The balun considered is also broadband, typically with a bandwidth 3:1 in a described embodiment. Its bandwidth can be extended beyond the one mentioned by increasing its thickness. The balun may also include an impedance transformer which typically transforms an impedance from a coaxial end (or a coax-via-line end) to a two-conductor end. In a particular embodiment there is an impedance ratio of 3.8 where there is to be a transition from a 50 Ohm coaxial cable (or a coax-via-transmission line) to a 188 Ohm two-conductor line in order to feed a so called self-complementary array antenna in front of a ground plane.

In a particular embodiment, a balun is devised to fit inside the boundaries of a "cell" where its maximum lateral size is $0.167*\lambda_{max}$, its minimum lateral size is $0.083*\lambda_{max}$ and its thickness is $0.04*\lambda_{max}$, wherein $\lambda_{max}$ is the wavelength at the lower frequency limit of operation. This is a very small volume, and in particular small thickness, regarding the low frequency limit of operation. These cells can be arranged to feed a dual polarized antenna with quadratic cells. The available space for a balun in such an array antenna is about the same as for an antenna element, that is about $\lambda_{max}/4$, or $0.25*\lambda_{max}$ in square.

Figure 6:
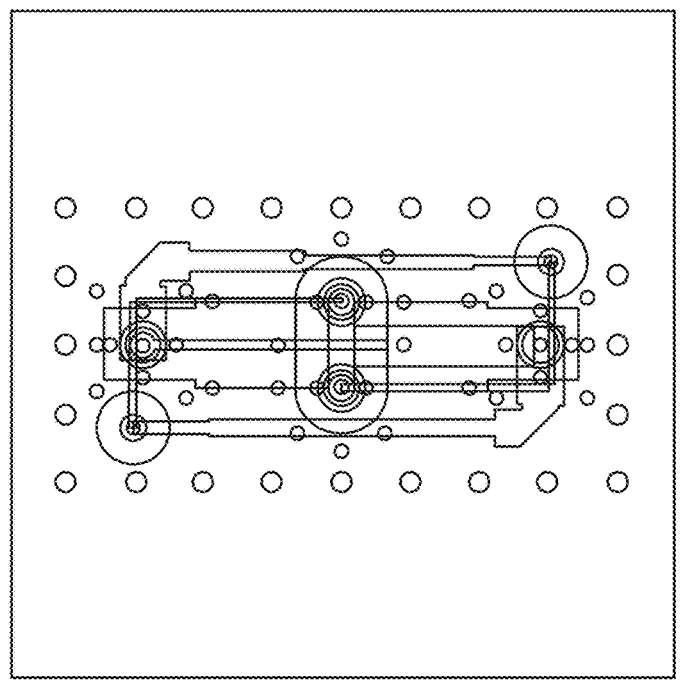
FIG. 6 shows a transparent top view of the balun of FIG. 2b having balanced output terminals arranged beside each other along an axis.
Figure 7:
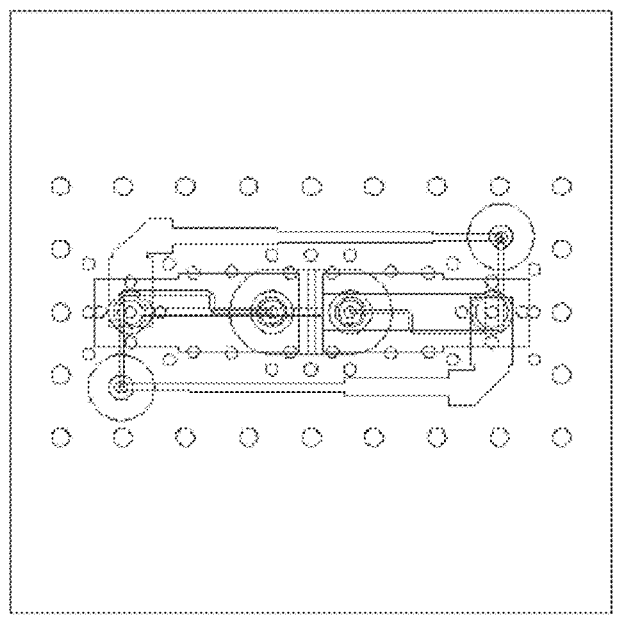
FIG. 7 shows a transparent top view of a balun having balanced output terminals arranged beside each other along an axis orthogonal to the axis of the output terminals of FIG. 6.
Figure 8A:
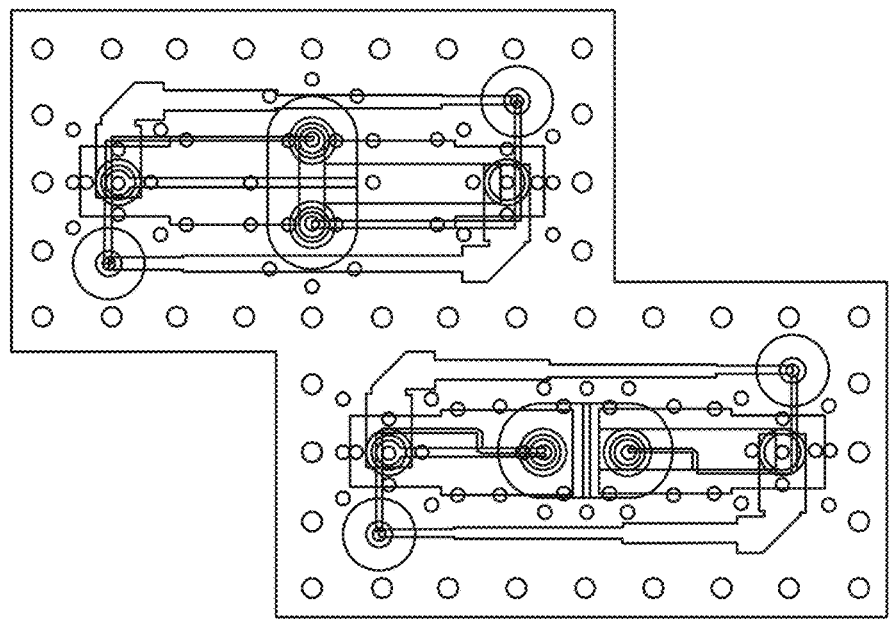
FIG. 8a shows a transparent top view of a combined arrangement of a balun of FIG. 6 combined with a balun of FIG. 7 sideways displaced.
Figure 8B:
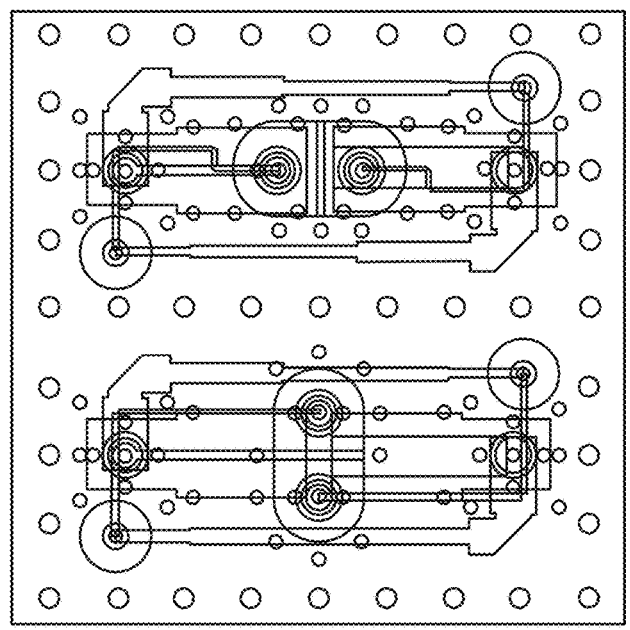
FIG. 8b shows a top view of a combined arrangement of a balun of FIG. 6 combined with a balun of FIG. 7 arranged side by side.

In order to feed a dual polarized phased array antenna (FIG. 1), two slightly different versions of the same type of balun can be used (FIG. 6 and FIG. 7) and be placed beside each other in a grid, see FIG. 8, in order to feed a dual polarised phased array antenna as e.g. the patch array depicted in FIG. 1. The ability to be placed beside each other and still being able to be housed within a cell area of an antenna element of the flat dual polarized phased array antenna constitutes a major advantage of the invention.

These two small broadband baluns can be placed in the periodic lattice in such a way that that they can feed an antenna array with two orthogonal polarisations.

Structure

The balun including impedance transformer can be said to consist of three lateral sections of transmission line layers. The sections are separated by partly perforated conducting screens.

Figure 5:
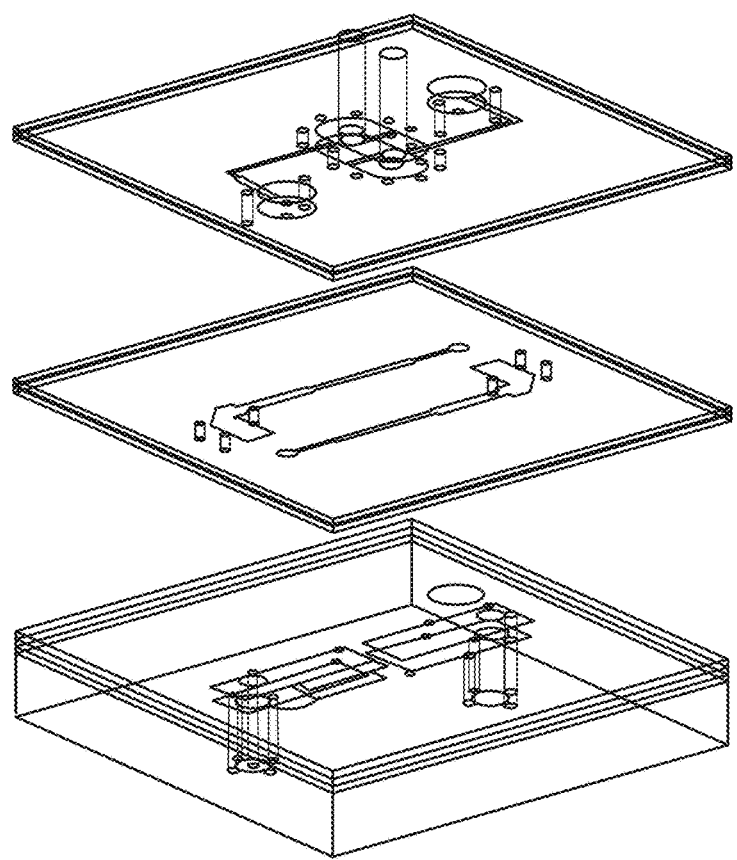
FIG. 5 shows a transparent exploded view of the balun of FIG. 2b

In the first section, see bottom part of FIG. 5, seen from the coaxial end the actual balun is located. The balun comprises an unbalanced part (with unbalanced transmission lines and a balanced part where two transmission lines, seen as a pair, constitute one balanced transmission line. Via input terminals, a coaxial line (alternatively a coax-via-line which is transferred to a strip line via a 90° bend) feeds a pair of (embedded) micro strip line via a gap. The coaxial line comprises a central first conductor, a concentrically arranged dielectric, and a peripheral concentrically arranged second conductor. A coax-via-line is here understood as a multiconductor transmission line where a centrally located conducting pin is symmetrically surrounded by a number of conducting pins (which all have the same potential) acting like a screen (outer conductor). In this example, four conductors surround the centre conductor 3201, 3442. (See FIGS. 32*f,* and 34.) Each conducting "pin" can possibly be implemented as a via hole, i.e. a metal plated drilled hole. A strip (transmission) line consists of a (usually) flat central conductor surrounded by two (larger) flat conductors which, for the normal mode of operation, both have the same potential.

(Alternatively one might describe the embedded micro strip line as an asymmetrical strip line because of the screening ground plane at the bottom but the mode operated is essentially that of a micro strip line.)

Regarding the two micro strip lines as a transmission line pair, the coaxial line excites a so called balanced mode where the signals are 180° out of phase in the two lines.

Figure 2A:
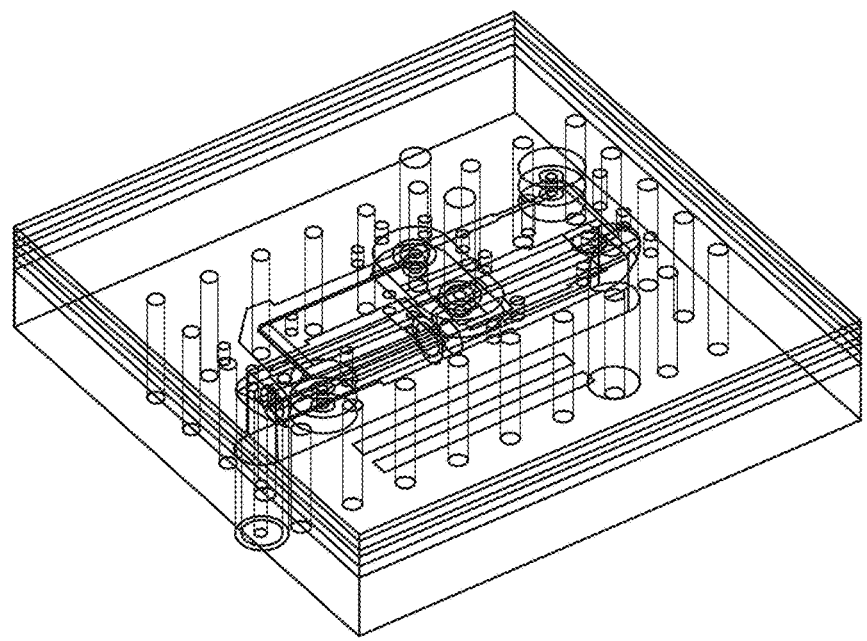
FIG. 2a shows a transparent perspective view of a balun having an unbalanced path being a coaxial transmission line.

The coaxial line (alternatively coax-via-line) enters the section through a hole (a slot) arranged in the lower ground plane 3200. Via a 90 degree bend the coaxial line (alternatively coa-via-line) is converted to a narrow strip transmission line. (See e.g. FIG. 32*a-e* (2CL−).) The centre conductor of the coaxial line (or coax-via-line) is connected to the centre conductor (2_1C−) of the strip (transmission) line. The screen of the coaxial line (or surrounding conductors of the coax-via-line) is(are) connected to the screen of the strip line (i.e. the upper and lower screen conductors of the strip line. (See FIGS. 2CL−) and (2_2C+).) The flat upper screen conductor of the strip line constitutes the signal conductor of (one half of) the balanced pair of micro strip transmission lines.

Seen across the gap, there is a "dummy line", i.e. a "mirror image" of the described coaxial line (or combination of coax-alternatively coax-via-line and the lateral strip line). The "mirror image" is given by a plane placed in the centre of the gap. The purpose of this "dummy line" is to provide exterior symmetry with respect to the balun junction (gap) in order to not create unwanted current distributions in the section limited by the bottom ground plane and the ground plane of the balanced micro strip line.

Figure 9:
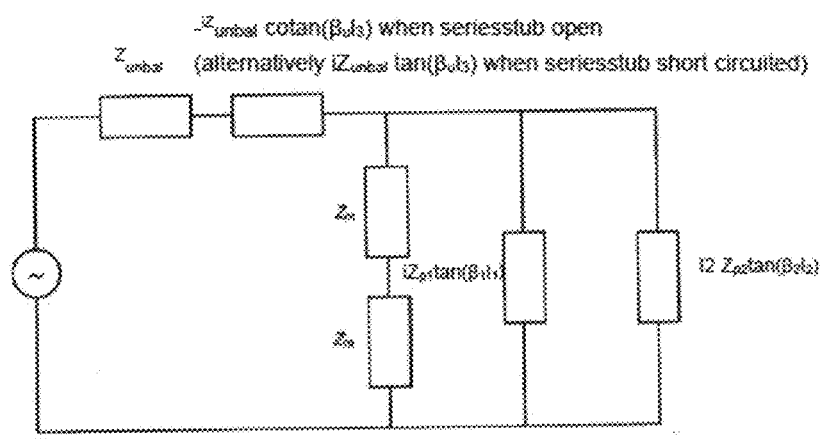
FIG. 9 shows a simple circuit model diagram of a balun.

The centre conductor of the stripline continues across the gap and is widened after the gap and then abruptly terminated (left as an open circuit) to create a capacitive coupling effect to the screen of the stripline (on the "dummy side") and indirectly to the balanced pair of microstrip lines. (From circuit point of view this open circuit "stub" acts as an impedance in series with the impedance of the unbalanced transmission line. (In alternative embodiment the centre conductor of the strip line (or coaxial line) might be short circuited at the gap, i.e. connected to the screen on the "dummy side" of the unbalanced transmission line directly after the gap (e.g via a via-hole). (See different options in the circuit model in FIG. 9.) The upper and lower screens of the strip transmission line are electrically connected at a number of points via vertical pins (via-holes) in order to suppress unwanted resonances and leakage.

Figure 3A:
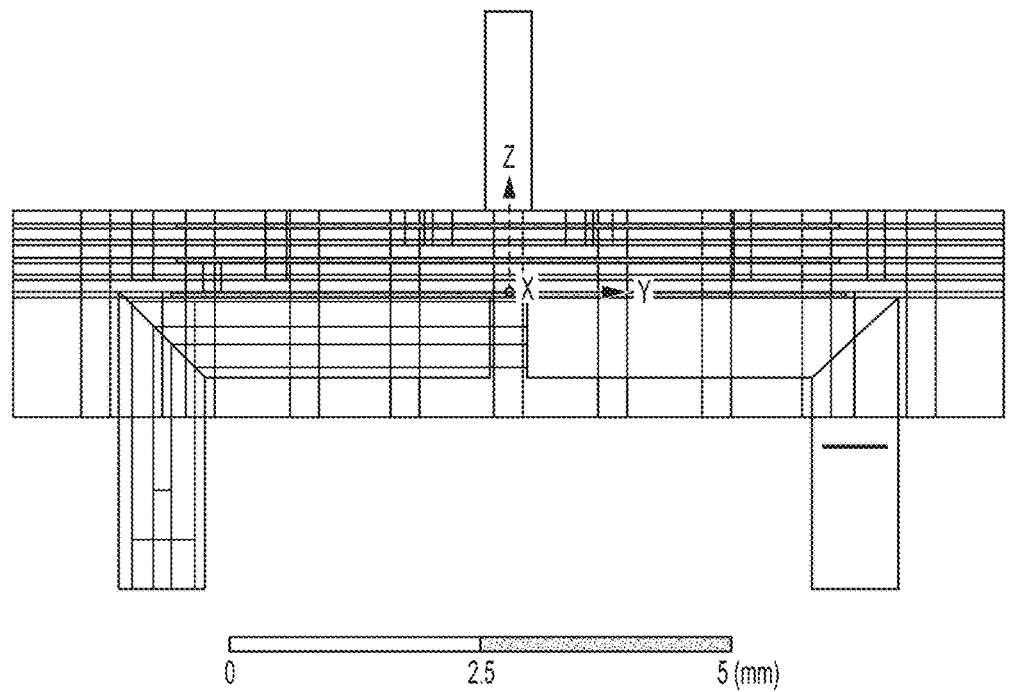
Figure 4A:
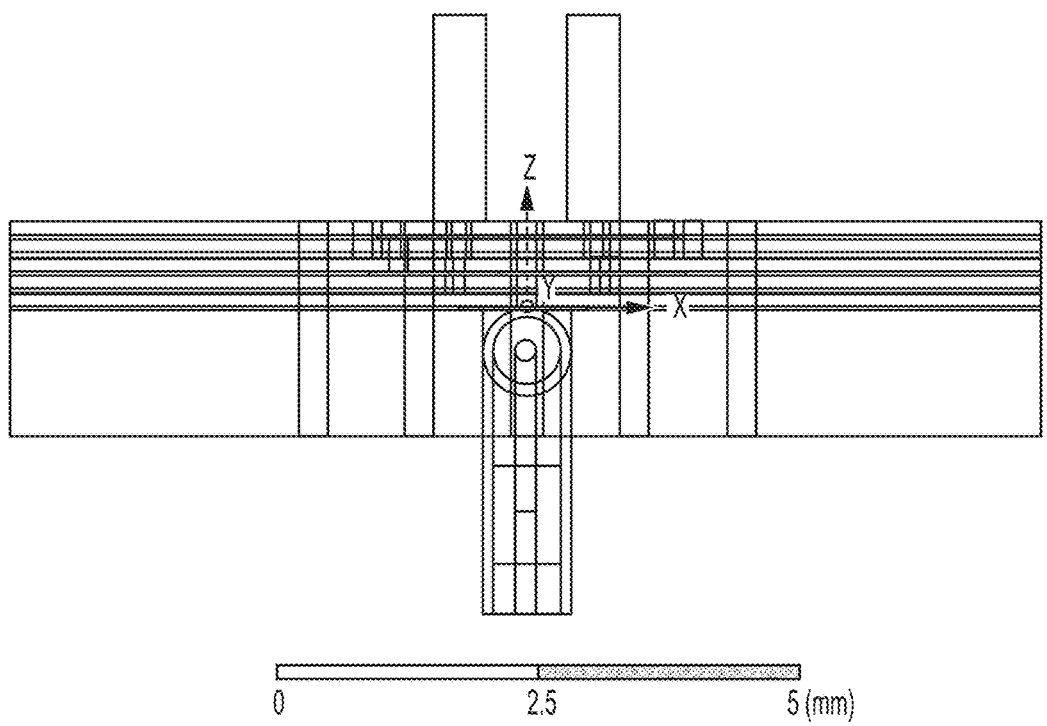
Figure 3B:
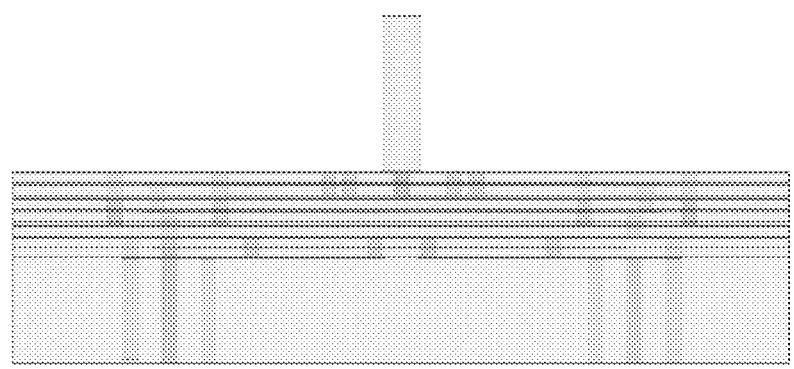
FIG. 3b shows a transparent side view of the balun in FIG. 2b.
Figure 4B:
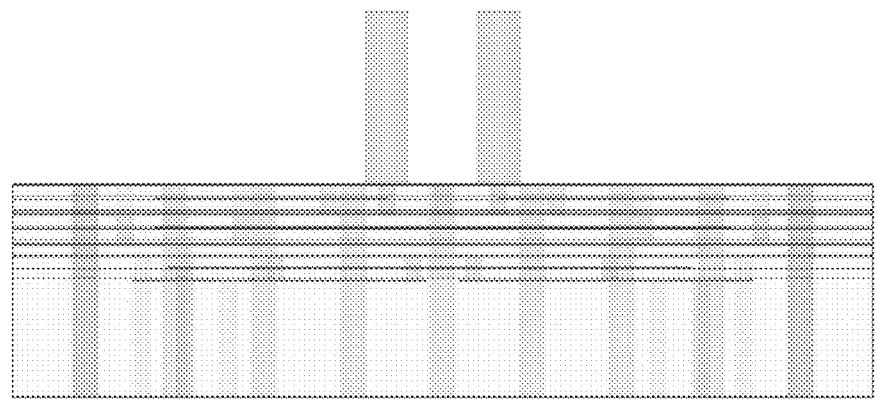
FIG. 4b shows another transparent side view of the balun in FIG. 2b

In an alternative embodiment, (FIG. 3*a*) the unbalanced transmission line and its dummy counterpart might consist of a coaxial line in both the vertical and lateral part of the unbalanced transmission line.

In yet another embodiment (not pictured) the lateral part of the unbalanced transmission line consists of a microstrip transmission line using the signal conductor of the balanced pair of microstrip transmission lines as groundplane.

Figure 2B:
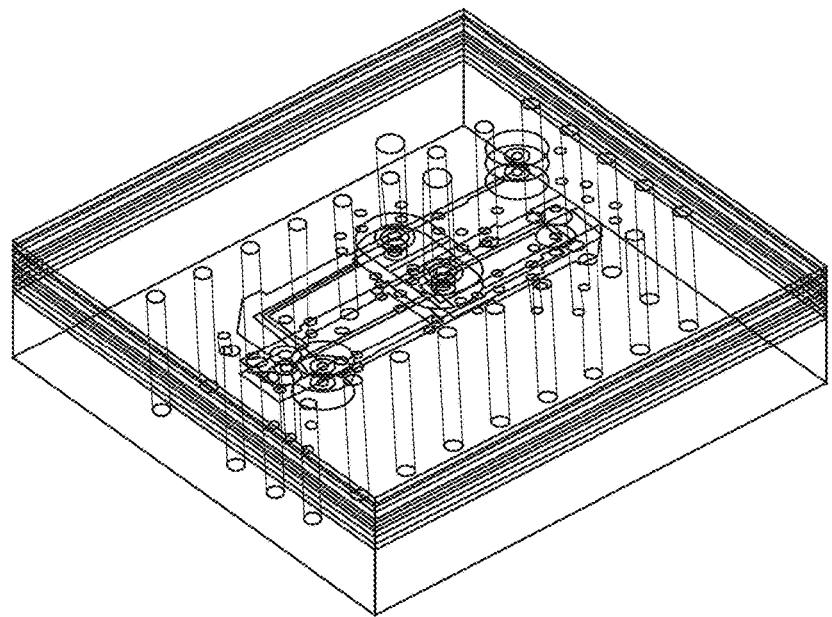
FIG. 2b shows a transparent perspective view of a balun having an unbalanced path being a coax-via-line combined with a strip line transmission line structure.

The "dummy line" is from an exterior point of view an exact "mirror" of the actual coaxial line (alt coax-via-line and stripline) in order to obtain exterior symmetry which is important in the design of a broadband balun. (The vertical section of coaxial line (or coax-via-line cluster) (z-directed in FIG. 2) and its dummy counterpart form a high impedance two-conductor line short circuited at the bottom ground plane. The two embedded microstrip lines are (from a circuit point of view) in series with each other but parallel to the impedance of the unbalanced line. In order to be matched to the unbalanced line their impedances have to be approximately half that of the unbalanced line disregarding reactive components in the actual transition and more importantly assuming that the (parasitic) two-conductor-line formed by the screen of the vertical coaxial line (or coax-via-screen) and its opposite dummy (described below) has a very high impedance just as the parasitic impedance created by the line formed by the lines formed by the unbalanced stripline screen (see FIG. 9), its dummy counterpart and the bottom groundplane. In a particular embodiment this two-conductor-line has an impedance of about $6.4 \ast Z_{unbal}$ where $Z_{unbal}$ is the characteristic impedance of the unbalanced line.

It is important for the operation of the balun that the vertical coaxial line screen (or coax-via-screen and its mirror dummy are separated as much as possible to get a high impedance $Z_{p1}$ of the two-conductor line formed since this parasitic two-conductor line is in parallel with the pair of balanced microstrip lines which has impedance $2Z_m$ as are the parasitic impedances formed by the bottom groundplane and the stripline screen and its dummy counterpart.

The screen of the unbalanced line and its dummy are both in electrical contact with the lower ground plane of section 1 forming "a cavity" together with some "via holes" limiting the volume the balun occupies. The screen of the unbalanced line and its dummy together also form a two-conductor line with impedance $Z_{p1}$ as previously mentioned. This vertical two-conductor line is in parallel with the balanced pair of microstrip lines which has impedance $2Z_m$. (The impedance of the individual halves of the microstrip lines are in series with each other.) It is essential for the design that the impedance of this short-circuited two-conductor line is high in comparison to the impedance of the balanced pair of microstrip lines since the power is to be transferred between the unbalanced line with impedance $Z_{unba}$l and the balanced pair of embedded microstrip lines and not between the unbalanced line and the two-conductor lines formed by the vertical screen of the unbalanced line and its dummy, neither is power to be transferred between the balanced mode of the two embedded microstrip lines and the two-conductor lines formed by the vertical screen of the unbalanced line and its dummy. Therefore the unbalanced line and its mirror dummy are aligned with the microstrip line and are separated as much as possible to obtain a large impedance between them before they bend down in a 90° angle towards the lower ground plane in section 1.

In a particular embodiment arranged for feeding a phased array, the impedance of the two-conductor line formed by the screens of the unbalanced line and its dummy, the impedance is 6.4 times the impedance of the unbalanced line; A large relationship between these two impedances is essential in order to keep the dimension of the cavity small, i.e. the distance to the lower ground plane small. In a particular embodiment the distance to the groundplane is $0.025*\lambda_{max}$, thus much shorter than $\lambda_{max}/4$ which would minimize the influence of this parasitic impedance.

The horizontal part of the screen of the unbalanced line and its dummy could also be considered to create a pair of two two-conductor lines (with respect to the mirror in the bottom ground plane), each with impedance $Z_{p2}$; these lines act in series with each other; the two lines are shortcircuited via the vertical sections of the screens of the unbalanced line and its dummy. This impedance $2Z_{p2}$ acts in parallel with the impedance formed by the vertical short-circuited two-conductor line and the balanced pair of microstriplines. The influence of this parasitic impedance is reduced maximally for a given wavelength $\lambda$ if the distance between the gap and the vertical short circuiting coax screen is $\lambda/4$. In a particular embodiment it is arranged to be $0.06*\lambda_{max}$.

The distance to the bottom groundplane and the distance from the gap to the short circuiting vertical screen of the unbalanced line and its dummy are all arranged to be very much less than $\lambda max/4$ and even less than $\lambda min/4$. The reason this balun still can be efficiently matched seen from the balanced pair of microstrip lines is that its impedance curve with respect to frequency "runs backwards in the Smithchart" and that its impedance curve is located to the left in the Smithchart with respect to the desired impedance of the output two-conductor line (Normally, given a time harmonic dependence $e^{j\omega t}$, an impedance curve runs clockwise with increasing frequency.) Its calculated performances for complete balun including impedance transformer and transition to two-conductor line (transmission from unbalanced line to two-conductor line, reflection at two-conductor port and total losses including radiation losses) can be seen in FIG. 10 and FIG. 11. The performance can be improved further if the distance to the bottom groundplane is increased slightly but yet such that it is both very much less than $\lambda_{max}/4$ and very much less than $\lambda_{min}/4$. Increasing the distance to the bottom groundplane will increase $Z_{p2}$ and reduce its parasitic influence. (See FIG. 9)

The open circuit "stub" on the "dummy side" of the unbalanced transmission line acts as a negative reactance (capacitance) in series with the unbalanced transmission line impedance $Z_{unbal}$ (stripline in the embodiment seen e.g. in FIG. 31) given that the stub is sufficiently short. The stub can to some extent compensate for the inductive behaviour of the parasitic impedances generated by the proximity of the bottom ground plane.

(The classes of baluns described in [3] are all based on open and short circuited stubs which are a quarter of a wavelength at some design frequency in the middle of the band of operation. This is not the case of the present invention where all corresponding "stubs" are considerably shorter and thus the size of the balun considerably smaller.)

The embedded microstrip lines in section 1 comprise some transformer steps to higher impedance (or continuous transformation to higher impedance) before a transition to transmission line layer 2 takes place. Transmission line layer 2 is a stripline layer.

Transition to transmission line layer two (section 2) takes place via a pair of apertures arranged in the upper ground plane of section, see FIG. 16 reference numerals 256 and 258. The pair of balanced microstrip lines are connected to a pair of balanced striplines via vertical conducting pins between the two layers. The centre pins and the apertures are surrounded by via holes connecting the lower and upper ground planes in the stripline layer (section 2). In a particular embodiment, the impedance of each individual microstrip line is about $0.42*Z_{unbal}$ where $Z_{unbal}$ is the impedance of the unbalanced line; the aperture diameter is arranged to be $0.01*\lambda_{max}$ In stripline layer 1 (section 2) the two "arms" of the balanced stripline are "folded" in opposite directions via two 90° bends. The pair of striplines are stepwise (or continuously) transformed to higher impedance in stripline layer 1. Eventually, an impedance level approximately half that of the two-conductor line is reached (in this layer or next layer). When each transmission line has reached the opposite end of the cell, a transition to yet another stripline layer takes place, stripline layer 2 (section 3). This transition is arranged to take place via a pair of apertures in the separating ground plane.

Voids for Signal Conditioning

For reasons of matching (balance and symmetry), apertures of equal size are arranged in the ground plane below stripline layer 1 and above stripline layer 2. Eventually the two balanced striplines are connected to a two-conductor line via an oblong hole with a metallic strip in the centre. For reasons of symmetry and matching there are arranged symmetrically located oblong holes in the upper and lower groundplane of stripline layer 2 The two stripline impedances act in series with each other and thus their impedances should be half that of the two-conductor line disregarding parasitic influence. A simple equivalent circuit model of the balun can be seen in FIG. 9.

Figure 10:
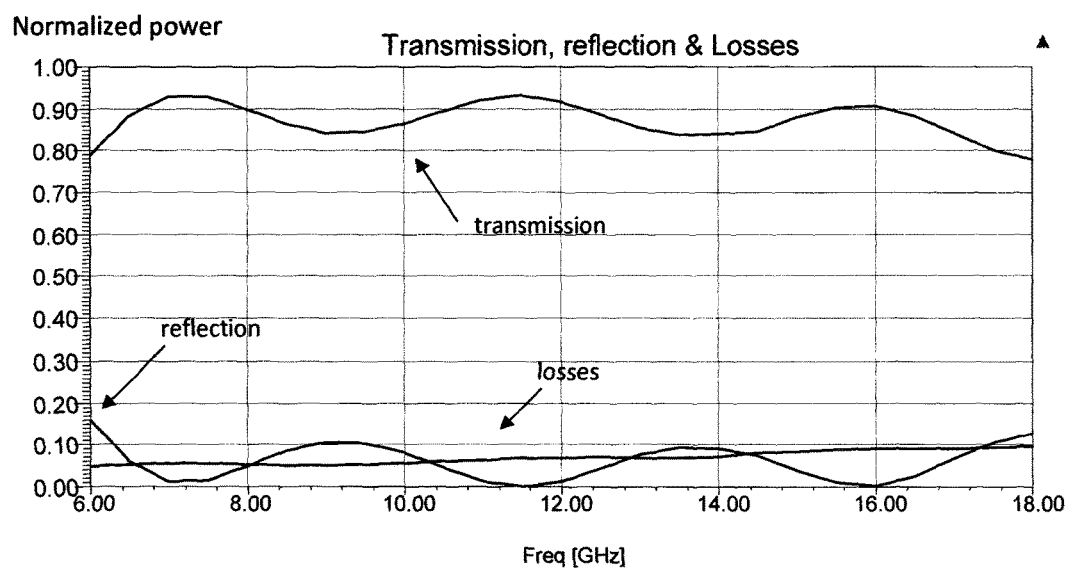
FIG. 10 shows a transmission, reflection and losses diagram for balun of FIG. 6.
Figure 11:
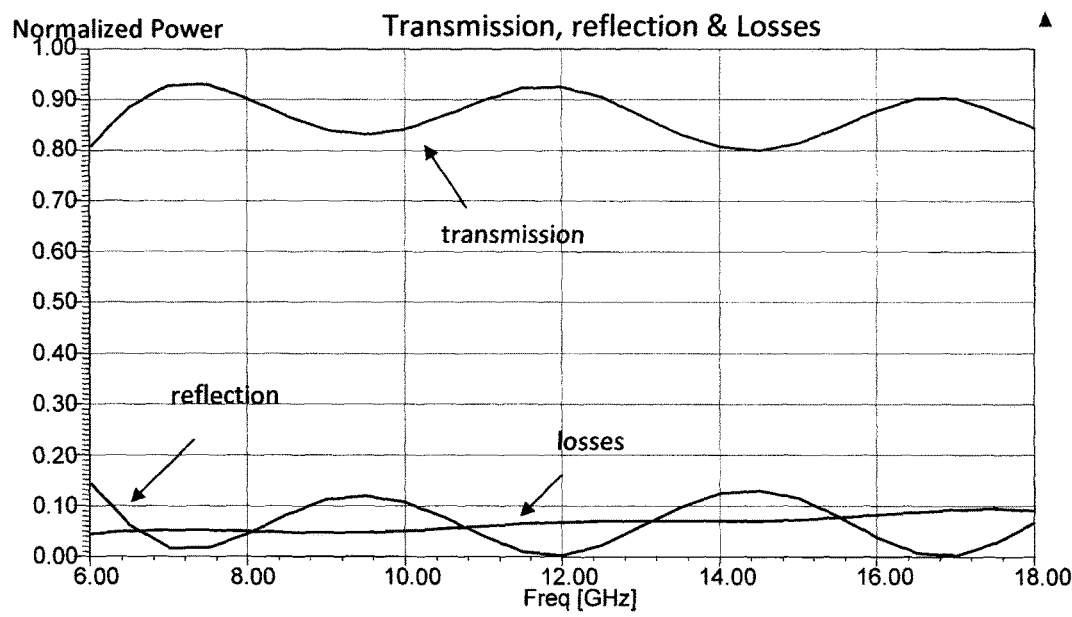
FIG. 11 shows a transmission, reflection and losses diagram for balun of FIG. 7.
Figure 31A:
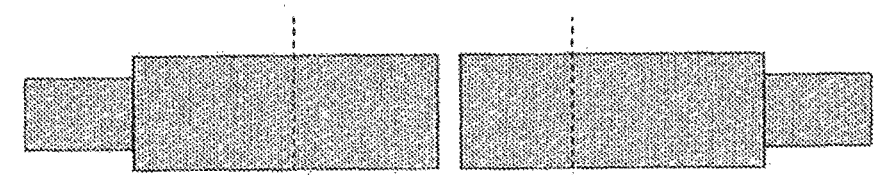
FIG. 31a, shows a detailed view of an upper layer of a balun region structure comprising a strip line transmission structure.
Figure 31B:
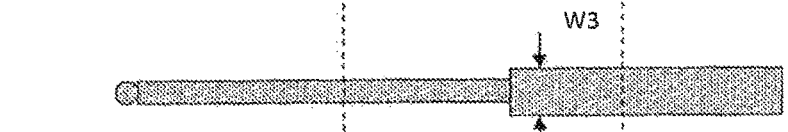
FIG. 31b, shows a detailed view of a mid layer of a balun region structure comprising a strip line transmission structure.
Figure 31C:
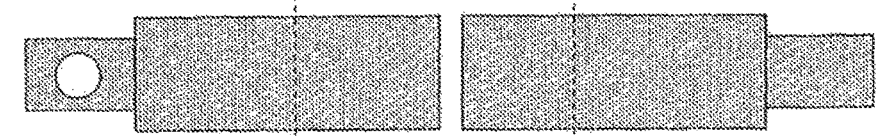
FIG. 31c, shows a detailed view of a lower layer of a balun region structure comprising a strip line transmission structure.
Figure 31D:
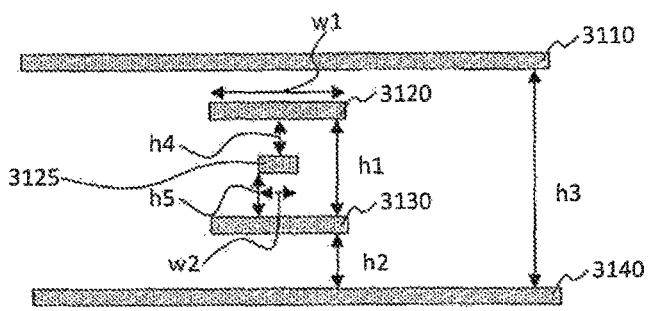
FIG. 31d shows a detailed view in cross section A-A of a balun region structure comprising strip line transmission structure including the layers of FIGS. 31a, 31b, and 31c.
Figure 33A:
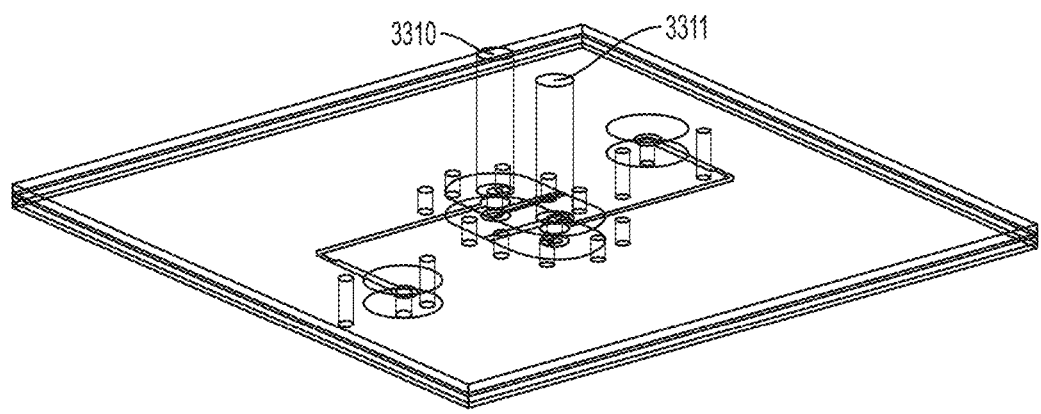
FIGS. 33a, 33b, 33c shows exploded perspective views of the layers of FIGS. 32a-f.
Figure 33B:
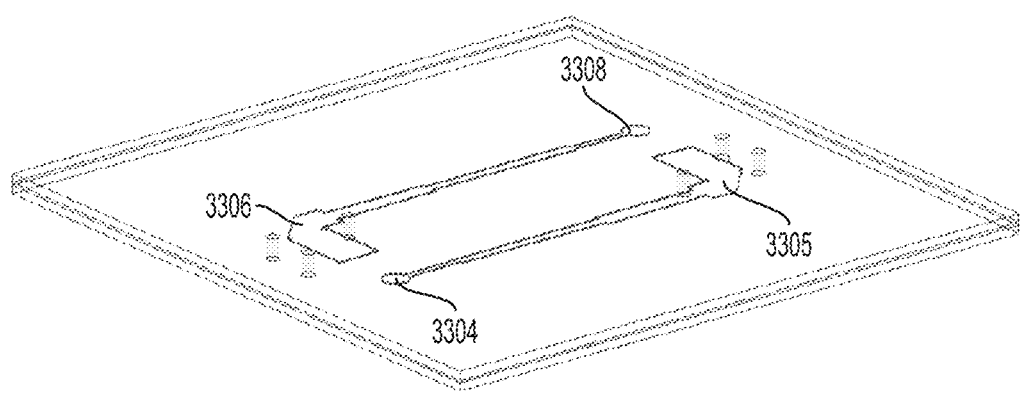
Figure 33C:
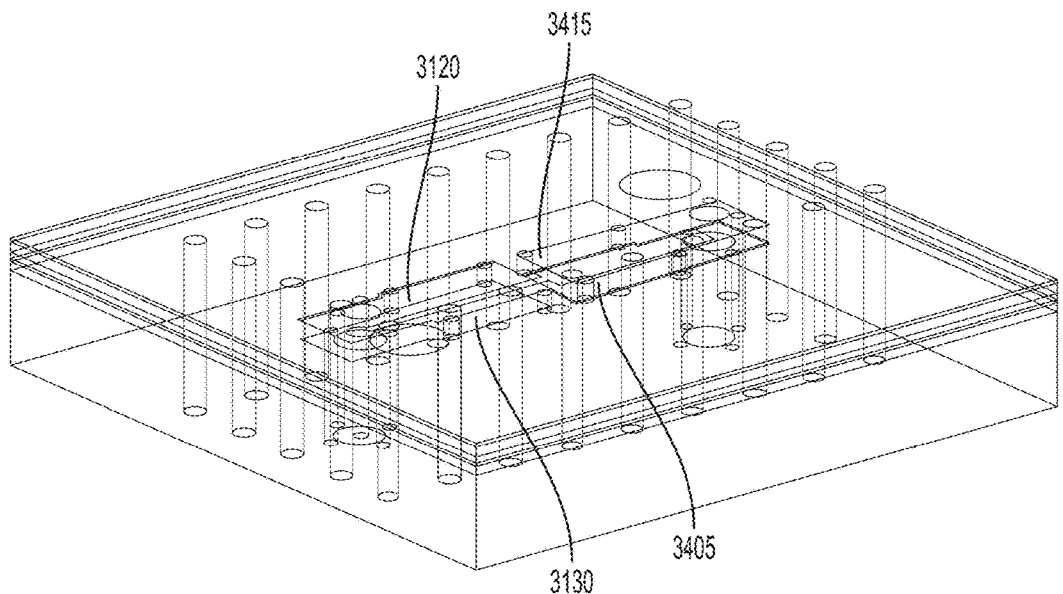
Figure 34:
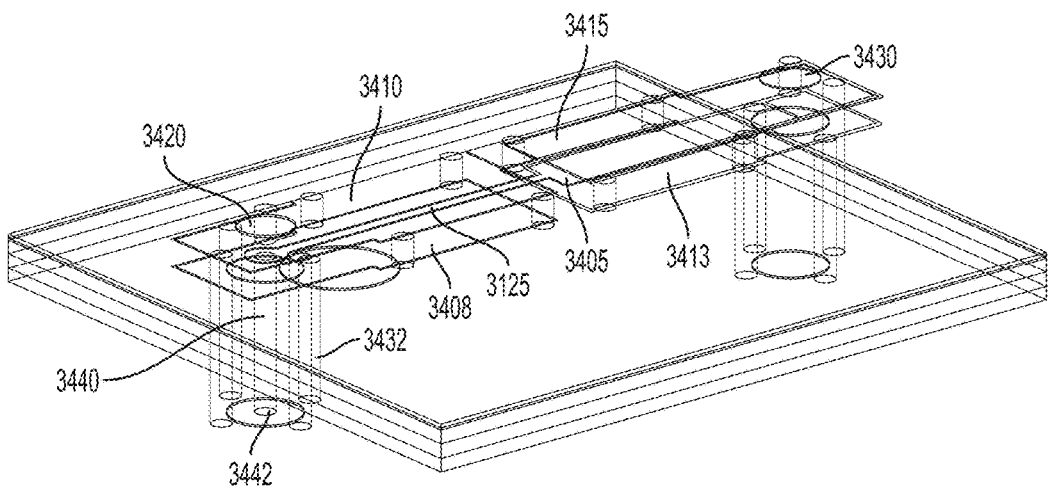
FIG. 34 shows an enlarged detail of the layers of FIG. 33c.

Calculated performances (transmission from coax to two-conductor port, reflection at two-conductor port and total losses) for baluns of type 1 and type 2 can be seen in FIG. 10 and FIG. 11.

Figure 35:
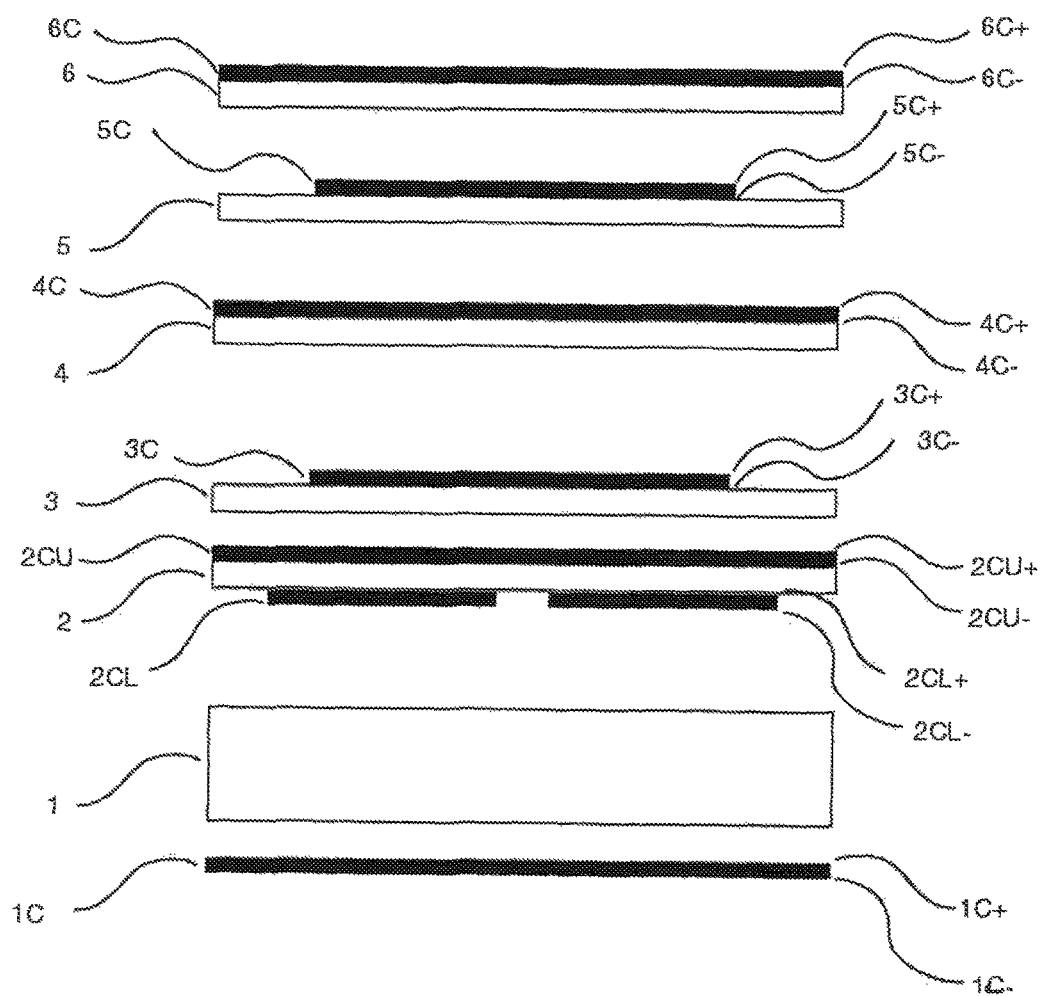
FIG. 35 shows very schematically the dielectric and conducting layers of a balun according to one example of the present disclosure.

In FIG. 35, a balun comprises a first conducting layer 1C; a first dielectric layer 1; a second conducting layer 2CL; a second dielectric layer 2; a third conducting layer 2CU; a third dielectric layer 3; a fourth conducting layer 3C; a fourth dielectric layer 4; a fifth conducting layer 4C; a fifth dielectric layer 5; a sixth conducting layer 5C; a sixth dielectric layer 6; and a seventh conducting layer 6C.

The first dielectric layer 1 is arranged between the first 1C and second 2CL conducting layers, the second dielectric layer 2 is arranged between the second 2CL and third 2CU conducting layers, and so on. The first conducting layer 1C comprises an oblong central void. The first dielectric layer 1 is provided with a cavity corresponding to said central void, such that the coaxial cable can be made to fit in said cavity, the coaxial cable having a central inner conductor and a concentric shield conductor and a space between them which may be filled with a dielectric material such as a polymer. The second conducting layer 2CL comprises a first conducting patch, and a second conducting patch. The patches are arranged symmetrically with coinciding length axes parallel to the length axis of the oblong central void and having a gap arranged between a first end of the first patch and a first end of the second patch. The shield conductor of the coaxial cable is arranged to make electrical contact to the first conducting patch. The shield conductor terminates at a position corresponding to the gap. The central inner conductor of the coaxial cable continues into a coaxial dummy line and is either terminated as an open circuit a distance into the dummy line or connected to the screen of the dummy line at the position of the gap.

Connecting signal vias are arranged to connect the patches of the second conducting layer 2CL with ends of patches of the third conducting layer 2CU. In one example, the patches are angled tapering patches.

In one example, the central void has a length axis which is a straight line In one example, the oblong central void has a first preferably rounded end and a second preferably rounded end. The central void is arranged to allow a coaxial cable just pass. A length of the central void is adapted to be a fraction of a predetermined wavelength within the frequency band to be transited.

At least one additional oblong void may be arranged beside the central void. In the illustrated example, at least one such additional oblong void is arranged on each side of the central void.

A plurality of locally short circuiting vias are in one example arranged in a pattern around the signal vias. The plurality of locally short circuiting vias are in one example connecting the third conducting layer 2CU with the fourth conducting layer 3C, and also with the fifth conducting layer 4C.

The invention is not limited to the specific balun(s) as shown in the figures and described in the text, but includes all variations within the scope of the present claims.

The invention claimed is:

1. A balun suitable for realizing a wideband transition in the radio frequency band from an unbalanced transmission line to a balanced transmission line, the balun comprising:
    an input terminal having a signal connection point and a screen connecting point;
    a two conductor output terminal;
    a layered structure comprising a number of conducting layers and dielectric layers alternatingly arranged on top of each other, the layered structure comprising at least one ground plane layer, and at least one signal transmission layer;
    an unbalanced signal path being connected to the signal connection point and the screen connecting point of the input terminal;
    a balanced signal path connected to the output terminal and being part of the layered structure; and
    a balun transition region for transforming the signal from an unbalanced signal to a balanced signal;
    wherein:
        the balun transition region comprises a non-conducting gap between the screen of the unbalanced signal and a dummy screen structure, the dummy screen structure being a mirror structure, mirrored in a plane of the gap, of a horizontal portion of the unbalanced signal path before the gap,
        a central conductor or signal conductor of the unbalanced signal path traverses the gap and enters a volume defined by the dummy screen structure,
        the screen of the unbalanced signal in the vicinity of the gap forms a first balanced conductor being part of the layered structure and the screen of the dummy screen structure, in vicinity of the gap, forms a second balanced conductor being part of the layered structure, and
        the unbalanced and balanced lines are aligned.

2. The balun according to claim 1, wherein:
    at least a portion of the unbalanced signal path is a coaxial cable, and
    the central conductor or signal conductor of the unbalanced signal path is a central conductor.

3. The balun according to claim 1, wherein:
    at least a portion of the unbalanced signal path is a stripline transmission structure or a coax-via-line transmission structure or a combination thereof, and
    the central conductor or signal conductor of the unbalanced signal path is a central conductor.

4. The balun according to claim 3, wherein at least one of an upper layer or upper layer screen of a stripline of the balun transition region is configured to simultaneously form a first portion of the balanced signal path.

5. The balun according to claim 1, wherein:
    at least a portion of the unbalanced signal path comprises a microstrip,
    the central conductor or signal conductor of the unbalanced signal path is a signal conductor, and
    the ground plane of the unbalanced microstrip and its dummy counterpart define a first portion of the signal conductors of the balanced line.

6. The balun according to claim 1, wherein the balanced signal path further comprises a dual impedance transformer, the dual impedance transformer being part of the layered structure.

7. The balun according to claim 6, wherein the balun comprises at least one vertical transition from a layer of the balun transition region to a layer of the dual impedance transformer.

8. The balun according to claim 6, wherein the balun comprises at least one vertical transition from one layer of the dual impedance transformer to another layer of the dual impedance transformer.

9. The balun according to claim 7, wherein the vertical transition is formed as signal vias.

10. The balun according to claim 9, wherein when the vertical transition traverses a ground plane, there is arranged a void in that ground plane.

11. The balun according to claim 10, wherein the void is 3 to 5 times the diameter of the vias.

12. The balun according to claim 1, wherein first ground connecting vias are configured to connect ground conducting layers.

13. The balun according to claim 12, wherein the first ground connecting vias form a rectangular arrangement enclosing signal carrying portions of the balun.

14. The balun according to claim 9, wherein a plurality of locally short circuiting, second ground connecting vias are arranged in a pattern around the signal vias, said plurality of locally short circuiting, second ground connecting vias are configured to connect ground conducting layers so as to at least decrease a local potential differences between the ground conducting layers.

15. The balun according to claim 1, comprising
    a first conducting layer;
    a first dielectric layer;
    a second conducting layer;
    a second dielectric layer;
    a third conducting layer;
    a third dielectric layer;
    a fourth conducting layer;
    a fourth dielectric layer;
    a fifth conducting layer;
    a fifth dielectric layer;
    a sixth conducting layer;

a sixth dielectric layer; and
a seventh conducting layer;
wherein:
the first dielectric layer is arranged between the first and second conducting layers, the second dielectric layer is arranged between the second and third conducting layers, and so forth,
the first conducting layer comprises an oblong central void,
the first dielectric layer is provided with a cavity corresponding to said central void, such that the coaxial cable can be made to fit in said cavity, the coaxial cable having a central inner conductor and a concentric shield conductor and a space between them which may be filled with a dielectric material such as a polymer,
the second conducting layer comprises a first conducting patch, and a second conducting patch, the patches being arranged symmetrically with coinciding length axes parallel to the length-axis of the oblong central void and having a gap arranged between a first end of the first patch and a first end of the second patch,
the shield conductor of the coaxial cable are configured to make electrical contact to the first conducting patch, the shield terminates at a position corresponding to the gap, the central inner conductor of the coaxial cable continues into a coaxial dummy line and is either terminated as an open circuit a distance into the dummy line or connected to the screen of the dummy line at the position of the gap, and
connecting signal vias are configured to connect the patches of the second conducting layer with wide ends of angled tapering patches of the third conducting layer.

16. The balun according to claim 15, wherein the oblong central void has a first rounded end, and a second rounded end, the central void being configured to allow a coaxial cable just pass, a length of the central void being adapted to be a fraction of a predetermined wavelength within the frequency band to be transited.

17. The balun according to claim 15, wherein the central void has a length axis which is a straight line.

18. The balun according to claim 15, wherein at least one additional oblong void is arranged beside the central void.

19. The balun according to claim 18, wherein there are arranged at least one such additional oblong void on each side of the central void.

20. The balun according to claim 15, wherein a number of locally short circuiting vias are arranged in a pattern around the signal vias, and connecting the third conducting layer with the fourth conducting layer, and also with the fifth conducting layer.

21. An antenna system comprising:
at least one antenna element,
at least one transmitter and/or receiver, and
at least one balun according to claim 1 operatively connected to the transmitter and/or receiver at the input terminal and to the at least one antenna at the conductor output terminals.

22. An antenna system according to claim 21, further comprising at least one pair of baluns arranged to feed two antenna elements of orthogonal polarization.

23. A antenna system according to claim 22, wherein an imagined first straight line passing the two conductor output terminals of a first balun in the pair of baluns is orthogonal in relation to an imagined second straight line passing the two conductor output terminals of a second balun in the pair of baluns.

24. An antenna system according to claim 22, wherein the first and second balun of each pair of baluns are arranged beside each other.

25. An antenna system according to claim 24, wherein the first and second balun of each pair of baluns are arranged displaced in relation to each other.

26. An antenna system according to claim 21, wherein the antenna elements are phased array antenna elements.

* * * * *